United States Patent
Nakamoto et al.

(10) Patent No.: US 12,060,276 B2
(45) Date of Patent: Aug. 13, 2024

(54) METHOD FOR PRODUCING AMORPHOUS SILICON SACRIFICE FILM AND AMORPHOUS SILICON FORMING COMPOSITION

(71) Applicant: Merck Patent GmbH, Darmstadt (DE)

(72) Inventors: Naoko Nakamoto, Kakegawa (JP); Takashi Fujiwara, Kakegawa (JP); Atsuhiko Sato, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 469 days.

(21) Appl. No.: 17/298,550

(22) PCT Filed: Nov. 26, 2019

(86) PCT No.: PCT/EP2019/082581
§ 371 (c)(1),
(2) Date: May 29, 2021

(87) PCT Pub. No.: WO2020/109301
PCT Pub. Date: Jun. 4, 2020

(65) Prior Publication Data
US 2022/0009782 A1 Jan. 13, 2022

(30) Foreign Application Priority Data
Nov. 29, 2018 (JP) .................. 2018-223620

(51) Int. Cl.
| | | |
|---|---|---|
| C01B 33/02 | (2006.01) | |
| C01B 33/021 | (2006.01) | |
| C08G 77/04 | (2006.01) | |
| C08G 77/06 | (2006.01) | |
| C09D 183/04 | (2006.01) | |
| H01L 21/3205 | (2006.01) | |
| H01L 21/3213 | (2006.01) | |

(52) U.S. Cl.
CPC .......... *C01B 33/021* (2013.01); *C08G 77/045* (2013.01); *C08G 77/06* (2013.01); *C09D 183/04* (2013.01); *H01L 21/32055* (2013.01); *H01L 21/32134* (2013.01); *C01P 2002/02* (2013.01)

(58) Field of Classification Search
CPC ..... C01B 33/021; C01B 33/02; C08G 77/045; C08G 77/06; C08G 77/60; C08G 77/62; C09D 183/04; C09D 183/16; H01L 21/32055; H01L 21/32134; H01L 29/66545; C01P 2002/02; C08L 83/16
USPC ........................................... 216/83
See application file for complete search history.

(56) References Cited

U.S. PATENT DOCUMENTS

| | | | |
|---|---|---|---|
| 7,118,943 B2 | 10/2006 | Yudasaka et al. | |
| 8,455,604 B1 | 6/2013 | Guo et al. | |
| 2003/0045632 A1* | 3/2003 | Shiho .................... | H01L 21/228 423/337 |
| 2004/0021177 A1 | 2/2004 | Akimoto et al. | |
| 2004/0053449 A1 | 3/2004 | Chang et al. | |
| 2008/0305611 A1 | 12/2008 | Hirota | |
| 2010/0112749 A1 | 5/2010 | Park et al. | |
| 2010/0184268 A1 | 7/2010 | Hirota | |
| 2011/0097873 A1 | 4/2011 | Lee et al. | |
| 2013/0287959 A1* | 10/2013 | Fish ..................... | B05D 3/0254 524/861 |
| 2015/0079756 A1 | 3/2015 | Yamawaki et al. | |
| 2016/0096978 A1 | 4/2016 | Tachibana et al. | |
| 2018/0201736 A1 | 7/2018 | Kawato | |
| 2018/0287003 A1* | 10/2018 | Seno ............... | H01L 31/022441 |

FOREIGN PATENT DOCUMENTS

| | | |
|---|---|---|
| JP | 2004-071696 A | 3/2004 |
| JP | 2004-111905 A | 4/2004 |
| JP | 2006-059937 A | 3/2006 |
| JP | 2006-245138 A | 9/2006 |
| JP | 2008-305974 A | 12/2008 |
| JP | 2010-248299 A | 11/2010 |
| JP | 2011-524641 A | 9/2011 |
| JP | 2015-084400 A | 4/2015 |
| JP | 2016-204487 A | 12/2016 |
| JP | 2018-517790 A | 7/2018 |
| KR | 10-2016-0040435 A | 4/2016 |

(Continued)

OTHER PUBLICATIONS

International Preliminary Report on Patentability received for PCT Patent Application No. PCT/EP2019/082581, mailed on Jun. 10, 2021, 8 pages.

(Continued)

*Primary Examiner* — Duy Vu N Deo
(74) *Attorney, Agent, or Firm* — Faegre Drinker Biddle & Reath LLP

(57) ABSTRACT

The present invention provides a method for producing a novel amorphous silicon sacrifice film and an amorphous silicon forming composition capable of filling trenches having a high aspect ratio to form an amorphous silicon sacrifice film that is excellent in affinity with a substrate. A method for producing an amorphous silicon sacrifice film, comprising (i) polymerizing a cyclic polysilane comprising 5 or more silicon or a composition comprising the cyclic polysilane by light irradiation and/or heating to form a polymer having a polysilane skeleton, (ii) applying an amorphous silicon forming composition comprising said polymer having a polysilane skeleton, polysilazane and a solvent above a substrate to form a coating film, and (iii) heating the coating film in a non-oxidizing atmosphere.

12 Claims, No Drawings

(56) References Cited

FOREIGN PATENT DOCUMENTS

TW              I554804   B     10/2016
WO        2013/081003  A1      6/2013

OTHER PUBLICATIONS

International Search Report and Written Opinion received for PCT Patent Application No. PCT/EP2019/082581, mailed on Jan. 31, 2020, 10 pages.

\* cited by examiner

METHOD FOR PRODUCING AMORPHOUS SILICON SACRIFICE FILM AND AMORPHOUS SILICON FORMING COMPOSITION

CROSS-REFERENCE TO RELATED APPLICATIONS

This application is a national stage application (under 35 U.S.C. § 371) of PCT/EP2019/082581, filed Nov. 26, 2019, which claims benefit of Japanese Application No. 2018-223620, filed Nov. 29, 2018, both of which are incorporated herein by reference in their entirety.

BACKGROUND OF THE INVENTION

Technical Field

The present invention relates to a method for producing an amorphous silicon sacrifice film and an amorphous silicon forming composition. Specifically, the present invention relates to a method for producing an amorphous silicon sacrifice film, which comprises applying an amorphous silicon forming composition comprising a specific polymer above a substrate to form a coating film and heating it.

Background Art

In the manufacture of electronic devices, especially semiconductor devices, an amorphous silicon film is used as a sacrifice layer to be replaced with a metal gate. Usually, an amorphous silicon film is formed by a CVD (Chemical vapor deposition) process. However, in the advanced node, when the CVD process is used excessive growth for narrow trenches is caused, so that repeated etching and CVD are required. Under such a circumstance, it is required to make possible to fill trenches narrower than 10 to 20 nm using a spin-on process comprising applying a liquid composition and baking it to form a film.

The composition used for the spin-on process includes a composition comprising polysilane. For example, it has been disclosed to form an amorphous silicon film using a composition comprising polysilane. However, in such a composition, since the affinity between the polymer contained in the composition and the substrate is low, the case in which a film can be formed using this is very limited.

PRIOR ART DOCUMENTS

Patent Documents

[Patent document 1] U.S. Pat. No. 8,455,604
[Patent Document 2] U.S. Pat. No. 7,118,943

SUMMARY OF THE INVENTION

Problems to be Solved by the Invention

The present invention has been made based on the background art as described above and provides a method for producing an amorphous silicon sacrifice film and an amorphous silicon forming composition capable of filling trenches having a high aspect ratio to form an amorphous silicon sacrifice film that is excellent in affinity with a substrate.

Means for Solving the Problems

The method for producing an amorphous silicon sacrifice film according to the present invention comprises:

(i) polymerizing a cyclic polysilane comprising 5 or more silicon or a composition comprising the cyclic polysilane by light irradiation and/or heating to form a polymer having a polysilane skeleton,
(ii) applying an amorphous silicon forming composition comprising said polymer having a polysilane skeleton, polysilazane and a solvent above a substrate to form a coating film, and
(iii) heating the coating film in a non-oxidizing atmosphere.

Further, the method for manufacturing electronic devices according to the present invention comprises:

producing an amorphous silicon sacrifice film by the method as described above, and
removing said amorphous silicon sacrifice film by etching using an aqueous alkaline solution.

Further, the amorphous silicon forming composition according to the present invention comprises:

(a) a polymer having a polysilane skeleton, which is formed by polymerizing a cyclic polysilane containing 5 or more silicon or a composition containing the cyclic polysilane by light irradiation and/or heating,
(b) a polysilazane, and
(c) a solvent.

Effects of the Invention

According to the producing method of the present invention, it is possible to produce an amorphous silicon sacrifice film which has high affinity to a substrate and is excellent in filling properties. This sacrifice film is resistant to hydrofluoric acid and can be removed with an aqueous alkaline solution. Furthermore, this sacrifice film has heat resistance as well.

DETAILED DESCRIPTION OF THE INVENTION

Mode for Carrying Out the Invention

Embodiments of the present invention are described below in detail. Hereinafter, symbols, units, abbreviations, and terms have the following meanings in the present specification unless otherwise specified.

In the present specification, when numerical ranges are indicated using "to", they include both end points, and the units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. These aliphatic hydrocarbon groups and aromatic hydrocarbon groups optionally contain fluorine, oxy, hydroxy, amino, carbonyl, or silyl and the like. Further, the aromatic ring means a hydrocarbon comprising a conjugated unsaturated ring structure, and the alicycle means a hydrocarbon comprising a ring structure but no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and includes a linear or branched alkyl in the cyclic structure as a side chain, if necessary.

In the present specification, the aryl means a group obtained by removing any one hydrogen from an aromatic hydrocarbon. The alkylene means a group obtained by removing any two hydrogen from a linear or branched, saturated hydrocarbon. The arylene means a hydrocarbon group obtained by removing any two hydrogen from an aromatic hydrocarbon.

In the present specification, the description such as "$C_{x-y}$", "$C_x$-$C_y$" and "$C_x$" means the number of carbons in the molecule or substituent group. For example, $C_{1-6}$ alkyl means alkyl having 1 to 6 carbons (such as methyl, ethyl, propyl, butyl, pentyl and hexyl). Further, the fluoroalkyl as used in the present specification refers to one in which one or more hydrogen in alkyl is replaced with fluorine, and the fluoroaryl is one in which one or more hydrogen in aryl are replaced with fluorine.

In the present specification, when a polymer comprises plural types of repeating units, these repeating units copolymerize. These copolymerizations can be any of alternating copolymerization, random copolymerization, block copolymerization, graft copolymerization, or any mixture thereof.

In the present specification, "%" represents mass % and "ratio" represents ratio by mass.

In the present specification, Celsius is used as the temperature unit. For example, 20 degrees means 20 degrees Celsius.

<Method for Producing Amorphous Silicon Sacrifice Film>

The method for producing an amorphous silicon sacrifice film according to the present invention comprises:
(i) polymerizing a cyclic polysilane comprising 5 or more silicon or a composition comprising the cyclic polysilane by light irradiation and/or heating to form a polymer having a polysilane skeleton,
(ii) applying an amorphous silicon forming composition comprising said polymer having a polysilane skeleton, polysilazane and a solvent above a substrate to form a coating film, and
(iii) heating the coating film in a non-oxidizing atmosphere.

In the present invention, the amorphous silicon sacrifice film means a film that is used as a sacrifice film in a semiconductor manufacturing process, and preferably used in a lithography process.

[Amorphous Silicon Forming Composition]

The amorphous silicon forming composition used in the present invention (hereinafter sometimes referred to as the composition) comprises (a) a polymer having a polysilane skeleton, (b) a polysilazane, and (c) a solvent.

In the present invention, the polysilane skeleton refers to a skeleton having a main chain composed only of Si—Si bonds. In the present invention, the polysilazane skeleton refers to a skeleton having a main chain composed of repeating units of Si—N bond.

(a) Polymer Having Polysilane Skeleton

The polymer having a polysilane skeleton used in the present invention is formed by polymerizing a cyclic polysilane comprising 5 or more silicon or a composition comprising the cyclic polysilane by light irradiation and/or heating.

The cyclic polysilane comprising 5 or more silicon (hereinafter sometimes referred to only as "cyclic polysilane") used in the production method according to the present invention can be freely selected unless it impairs the effect of the present invention. These are either inorganic compounds or organic compounds and can be linear, branched, or partially having a cyclic structure.

Preferably, the cyclic polysilane is represented by the following formula (I):

wherein, $R^{Ia}$ and $R^{Ib}$ are each independently hydrogen, halogen, $C_{1-6}$ alkyl or $C_{6-10}$ aryl, and p is an integer of 5 or more.

Preferably, p is 5 to 8, and more preferably 5 or 6.

Examples of the preferred cyclic polysilane include silyl cyclopentasilane, silyl cyclohexasilane, disilyl cyclohexasilane, cyclopentasilane and cyclohexasilane, more preferably cyclopentasilane or cyclohexasilane.

For example, when using a cyclic polysilane that is liquid at room temperature, such as cyclopentasilane or cyclohexasilane, light irradiation and/or heating can be performed while stirring the cyclic polysilane. When the cyclic polysilane is a solid at room temperature, the composition comprising the cyclic polysilane comprises a suitable solvent. Suitable solvents include, for example, cyclohexane, cyclooctane and the like.

In the step (i), the cyclic polysilane or a composition comprising the cyclic polysilane is polymerized by light irradiation and/or heating.

In the case of light irradiation, light having the wavelength of preferably 248 to 436 nm, more preferably 282 to 405 nm is irradiated. The irradiation intensity is preferably 10 to 250 mW/cm$^2$, more preferably 50 to 150 mW/cm$^2$, and the irradiation time is preferably 30 to 300 seconds, more preferably 50 to 200 seconds.

In the case of heating, it is preferable to carry out the polymerization at 40 to 200° C. for 3 to 300 minutes.

It is also preferable to combine the light irradiation and heating described above. It is considered that some or all of the cyclic polysilane undergo ring-opening reaction by the light irradiation and/or heating in this step. In addition, the amorphous silicon forming composition in the step (ii) can contain a cyclic polysilane which is not ring-opened.

The polymer obtained as described above gives a composition that exhibits excellent properties, and the obtained structure includes, for example, those exemplified below. However, since various structures may be possible depending on the kind of the monomer, the mixing ratio and the like, it is conceivable that structures other than those shown below can be taken.

The polymer having a polysilane backbone formed in the step (i) preferably has 5 or more repeating units selected from the group consisting of the following formulas (I-1) to (I-3):

(I-1)

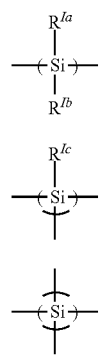

(I-2)

(I-3)

wherein, $R^{Ia}$, $R^{Ib}$ and $R^{Ic}$ are each independently hydrogen, halogen, $C_{1-6}$ alkyl or $C_{6-10}$ aryl.

Examples of $R^{Ia}$, $R^{Ib}$ and $R^{Ic}$ include hydrogen, methyl, ethyl, n-propyl, isopropyl, n-butyl, isobutyl, phenyl, tolyl and xylyl. Preferably, all of $R^{Ia}$, $R^{Ib}$ and $R^{Ic}$ are hydrogen. Combination of the repeating units (I-1) (I-2) and (I-3) is not particularly limited, but it is preferred that at least one of (I-2) or (I-3) is included.

The total number of the repeating units of the formulas (I-1) to (I-3) contained in one molecule is preferably 5 to 20, and more preferably 5 to 15. It is preferred that each repeating unit is directly bonded to form a Si—Si bond.

The weight average molecular weight of the polymer having a polysilane skeleton used in the present invention is preferably 500 to 25,000, and more preferably 1,000 to 15,000. The mass average molecular weight is a mass average molecular weight in terms of polystyrene, and it can be measured by gel permeation chromatography based on polystyrene.

(b) Polysilazane

The polymer having a polysilazane skeleton used in the production method according to the present invention can be freely selected unless it impairs the effects of the present invention. These are either inorganic compounds or organic compounds, and can be linear, branched, or partially having a cyclic structure.

Preferably, the polysilazane used in the present invention comprises at least 20 repeating units selected from the group consisting of the following formulae (II-1) to (II-6):

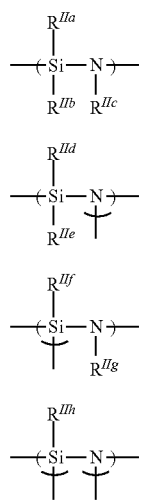

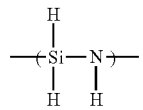

wherein $R^{IIa}$ to $R^{IIi}$ are each independently hydrogen or $C_{1-4}$ alkyl.

The number of the repeating units is preferably 20 to 350, and more preferably 20 to 130. It is preferred that each repeating unit is directly linked without intervening repeating units other than (II-1) to (II-6).

More preferably, the polysilazane used in the production method according to the present invention is perhydropolysilazane (hereinafter referred to as "PHPS"). The PHPS is a silicon-containing polymer comprising Si—N bonds as repeating units and consisting only of Si, N and H. In this PHPS, except Si—N bond, all elements binding to Si and N are H, and any other elements such as carbon and oxygen are not substantially contained. The simplest structure of the perhydropolysilazane is a chain structure having a repeating unit of the following formula:

$$\begin{array}{c} H \\ | \\ -\!\!\!-\!\!\!(\mathrm{Si}\!-\!\mathrm{N})\!\!-\!\!\!- \\ | \ \ | \\ H \ \ H \end{array}$$

In the present invention, any PHPS having a chain structure and a cyclic structure in the molecule can be used, and examples of the PHPS include those comprising repeating units represented by the following formulae (IIa) to (IIf) and a terminal group represented by the following formula (IIg) in the molecule:

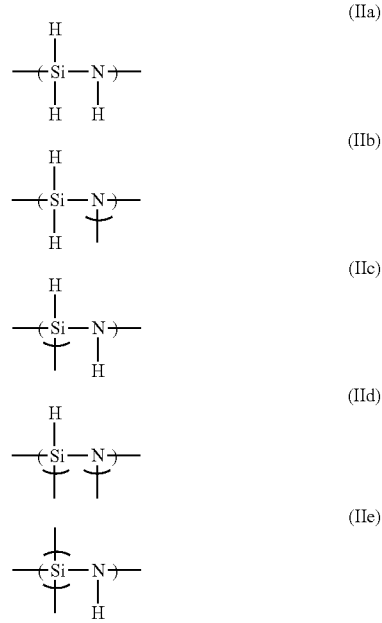

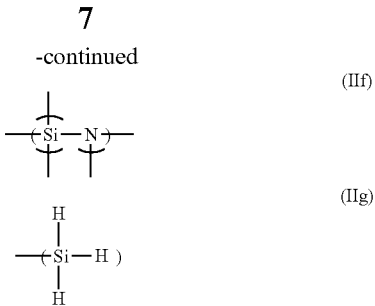

Such PHPS has a branched structure or a cyclic structure in the molecule, and an example of a specific partial structure of such PHPS is shown in the following formula.

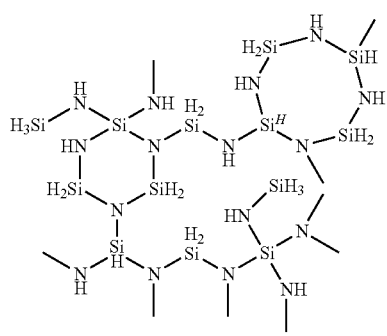

Further, it has or has not a structure represented by the following formula, i.e. a structure wherein plural Si—N molecular chains are crosslinked:

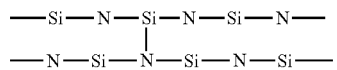

As far as the PHPS according to the present invention comprises Si—N bonds as the repeating unit and is a silicon-containing polymer consisting only of Si, N and H, its structure is not limited, and other various structures exemplified above are possible. For example, it can be one having a structure composed by combining the above-described linear structure, cyclic structure and crosslinked structure. In addition, the PHPS in the present invention is preferably one having a cyclic structure or crosslinked structure, particularly crosslinked structure.

From the viewpoint of solubility in solvents and reactivity, the mass average molecular weight of the polysilazane used in the production method according to the present invention is preferably 900 to 15,000, and more preferably 900 to 10,000. The mass average molecular weight is a mass average molecular weight in terms of polystyrene, and it can be measured by gel permeation chromatography based on polystyrene.

Although the mixing ratio of said polymer having a polysilane skeleton (a) to polysilazane (b) is not particularly limited, it is preferred that the ratio of the number of silicon atoms contained in the cyclic polysilane to that of silicon atoms contained in polysilazane is 0.3 to 114. Further, the ratio of the number of moles of the cyclic polysilane to that of polysilazane is preferably 0.05 to 20. The amorphous-forming composition according to the present invention can contain an unreacted cyclic polysilane as described above, but for the numerical values here, unreacted cyclic polysilane shall also be included in the cyclic polysilane.

Further, in the composition, the ratio of the total number of the repeating units of formulae (I-1) to (I-3) contained in the polymer having a polysilane skeleton to that of the repeating units of the formulae (II-1) to (II-6) contained in polysilazane (in the present invention, sometimes referred to as "repeating unit ratio") is preferably 4 to 54, and more preferably 6 to 27.

As the method for measuring the repeating unit ratio, for example, in the spectrum obtained by quantitative $^{29}$Si-NMR in accordance with inverse gate decoupling method (in the present invention, sometimes referred to as "$^{29}$Si-NMR"), it can be measured by a ratio of the peak area detected at −95 ppm to −115 ppm to that detected at −25 ppm to −55 ppm.

In the present invention, the measurement of $^{29}$Si-NMR can be specifically carried out as described below.

First, using an evaporator, a solvent is removed, from the polymer of (a) and (b) according to the present invention obtained by synthesis, and 0.4 g of the resulted polymer mixture is dissolved in 1.6 g of a deuterated solvent such as deuterated chloroform (manufactured by Kanto Chemical Co., Inc.) to obtain a sample solution. Using a JNM-ECS 400 type nuclear magnetic resonance apparatus (trade name, manufactured by JEOL Ltd.), a $^{29}$Si-NMR spectrum of the sample solution is obtained by measuring 1,000 times. In NMR spectra, a peak assigned to Si contained in a polysilazane skeleton (δ=around −25 to −55 ppm) and a peak assigned to Si contained in a polysilane skeleton (δ=around −95 to −115 ppm) are recognized.

(c) Solvent

The composition according to the present invention comprises a solvent. The solvent is selected from those which uniformly dissolve or disperse each component contained in the composition. Specifically, examples of the solvent include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether (PGME) and propylene glycol monoethyl ether; propylene glycol alkyl ether acetates such as propylene glycol monomethyl ether acetate (PGMEA), propylene glycol monoethyl ether acetate and propylene glycol monopropyl ether acetate; aromatic hydrocarbons, such as benzene, toluene, xylene and mesitylene; ketones, such as methyl ethyl ketone, acetone, methyl amyl ketone, methyl isobutyl ketone and cyclohexanone; alcohols, such as isopropanol and propanediol; and alicyclic hydrocarbons, such as cyclooctane and decalin. Preferred are cyclooctane, toluene, decalin and mesitylene.

These solvents may be used alone or in combination of two or more of any of these.

In order to homogeneously dissolve polymer, the relative dielectric constant of the solvent is preferably 3.0 or less, more preferably 2.5 or less on the basis of the value described in "Solvent Handbook, 1st Edition", Kodansha Scientific.

Although the mixing ratio of the solvent varies depending on the coating method and the film thickness after coating, the ratio (solid content ratio) of the compounds other than the solvent is 1 to 96 mass %, and preferably 2 to 60 mass %.

The composition used in the present invention essentially comprises the above-mentioned (a) to (c), but if necessary, further compounds can be combined. The materials which can be combined are described below. The components other than (a) to (c) contained in the whole composition are preferably 10% or less, and more preferably 5% or less, based on the total mass.

(d) Optional Components

In addition, the composition according to the present invention can contain optional components, if needed. Such optional components include, for example, surfactants.

Surfactants are preferably used because they can improve the coating properties. The surfactants which can be used in the siloxane composition of the present invention include nonionic surfactants, anionic surfactants, amphoteric surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycols; acetylene alcohol derivatives, such as polyethoxylate of acetylene alcohol; acetylene glycol derivatives, such as polyethoxylate of acetylene glycol; fluorine-containing surfactants, for example, FLUORAD (trade name, manufactured by 3M Japan Limited), MEGAFAC (trade name: manufactured by DIC Cooperation), SURFLON (trade name, manufactured by AGC Inc.); or organosiloxane surfactants, for example, KP341 (trade name, manufactured by Shin-Etsu Chemical Co., Ltd.), and the like. Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol, and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid, and the like.

Further, examples of the amphoteric surfactant include 2-alkyl-N-carboxymethyl-N-hydroxyethyl imidazolium betaine, lauric acid amide propyl hydroxysulfone betaine, and the like.

These surfactants can be used alone or in combination of two or more of any of these, and the mixing ratio thereof is usually 50 to 10,000 ppm, and preferably 100 to 5,000 ppm, based on the total mass of the composition.

[Production of Amorphous Silicon Sacrifice Film]

The production method according to the present invention comprises applying the above amorphous silicon forming composition above a substrate to form a coating film and heating the coating film.

The method for coating the composition above a substrate surface can be freely selected from known methods, such as spin coating, dip coating, spray coating, transfer coating, roll coating, bar coating, brush coating, doctor coating, flow coating, slit coating, and the like. Moreover, as a substrate on which the composition is coated, suitable substrates, such as a silicon substrate, a glass substrate, a resin film, can be used. Various semiconductor devices and the like can be formed on these substrates, if necessary. When the substrate is a film, gravure coating can be also used. A drying step can also be provided separately after coating a film if desired. Further, by repeating the coating step once or twice or more as needed, the film thickness of the coating film to be formed can be made as desired.

After forming a coating film of the composition according to the present invention, it is preferred to carry out pre-baking (heating treatment) of the coating film in order to dry the coating film and reduce the residual amount of the solvent. The pre-baking process can be carried out in a non-oxidizing atmosphere preferably at a temperature of 80 to 200° C., in the case of a hot plate for 10 to 300 seconds and in the case of a clean oven for 1 to 30 minutes. In the present invention, the non-oxidizing atmosphere means an atmosphere having an oxygen concentration of 1 ppm or less and a dew point of −76° C. or lower. Preferably, a gas atmosphere of $N_2$, Ar, He, Ne, $H_2$, or a mixture of two or more of any of these is used.

Thereafter, the coating film is heated to cure, thereby forming an amorphous silicon sacrifice film. So long as it is a temperature at which a coating film having appropriate crystallinity can be obtained, the heating temperature in this heating step is not particularly limited and can be freely determined. However, chemical resistance of the cured film sometimes become insufficient or dielectric constant of the cured film sometimes become increased. From this point of view, for the heating temperature, a relatively high temperature is generally selected. In order to accelerate the curing reaction and obtain a sufficiently cured film, the curing temperature is preferably 200° C. or higher, and more preferably 300° C. or higher. In general, the curing temperature is preferably 1,000° C. or lower, because crystallization of amorphous silicon proceeds. Further, the heating time is not particularly limited and is generally 0.001 seconds to 24 hours, and preferably 0.001 seconds to 10 hours. Flash annealing can be used for the heating. In addition, this heating time is the time after the temperature of the coating film reaches a desired heating temperature. Normally, it takes several minutes to several hours until the coating film reaches a desired temperature from the temperature before heating. Further, it is preferred that the atmosphere at the time of curing is a non-oxidizing atmosphere.

After forming a coating film using the composition according to the present invention, light irradiation to the coating film can be further carried out. It is possible to suppress the decrease in film thickness in the curing step by light irradiating to the coating film. The light irradiation is preferably to irradiate light having the wavelength of 248 to 436 nm, and more preferably 282 to 405 nm. The irradiation intensity is preferably 10 to 700 $mW/cm^2$, and more preferably 40 to 500 $mW/cm^2$, and the irradiation time is preferably 30 to 3,000 seconds, and more preferably 50 to 2,500 seconds.

The crystallinity of the formed sacrifice film can be evaluated by X-ray diffraction (XRD). Here, if no diffraction peak of crystalline Si is observed after curing, it is confirmed that the sacrifice film is made of amorphous silicon. The film thickness of the obtained amorphous silicon sacrifice film can be generally 1 nm to 2 μm, preferably 5 to 800 nm, and more preferably 10 to 500 nm.

The amorphous silicon sacrifice film is easily dissolved in an aqueous alkaline solution, and therefore can be etched by the aqueous alkaline solution when the sacrifice film is peeled off. The aqueous alkaline solution to be used for the etching is not particularly limited, and examples thereof include aqueous potassium hydroxide solution, aqueous sodium hydroxide solution, ammonia water, aqueous tetramethylammonium hydroxide (TMAH) solution and the like.

The etching resistance is changed by adjusting the conditions of producing the sacrifice film, particularly the heating conditions. On the other hand, the amorphous silicon sacrifice film can be easily dissolved by adjusting the etching conditions such as changing the type of etching solution or the temperature of the etching solution.

For example, the etching rate for a 10 mass % aqueous potassium hydroxide solution at room temperature (20 to 30° C.) is preferably 0.01 to 100 nm/min, and more preferably 1 to 100 nm/min. When a film is formed by heating at a high temperature of 500° C. or higher at the time of producing a sacrifice film, the etching rate can be accelerated using a 10 mass % TMAH aqueous solution at 60° C.

On the other hand, this amorphous silicon sacrifice film is resistant to a hydrofluoric acid aqueous solution and the like. Specifically, the etching rate to a 0.5 mass % hydrofluoric acid aqueous solution at room temperature is preferably 0 to 100 nm/min, more preferably 0 to 50 nm/min, and still more preferably 0 to 20 nm/min.

Further, the method for manufacturing an electronic device according to the present invention comprises producing an amorphous silicon sacrifice film by the method described above and removing the amorphous silicon sacrifice film by etching using an aqueous alkaline solution. The amorphous silicon sacrifice film can be used as an etching mask at the time of processing of silicon oxide or silicon nitride and is also useful as a sacrifice film at the time of producing a metal gate or the like.

Hereinafter, the present invention is explained with reference to Examples. These Examples are for explanation and are not intended to limit the scope of the present invention.

In addition, in the following description, "part" is on a mass basis unless otherwise specified.

The reaction steps in the following Examples were all carried out in a glove box controlled to have an oxygen concentration of 1.0 ppm or less and a dew point temperature of −76.0° C. or lower under a nitrogen atmosphere.

Example 1

A stirrer tip was placed in a 6 mL screw tube, and 269 mg (1.49 mmol) of cyclohexasilane was added thereto and stirring was carried out using a stirrer. Here, 8.6 J/cm$^2$ of ultraviolet ray having the wavelength of 365 nm was irradiated using a mercury xenon lamp as a light source. After the ultraviolet irradiation, 29.38 mg (0.326 mmol) of polyperhydrosilazane solution adjusted to a concentration of 50 mass % with cyclooctane and having the weight average molecular weight of 5,800 was added and stirring was carried out for 20 minutes. Additionally, cyclooctane was added so as to make the solid content concentration become 19 mass % and stirring was carried out for 3 minutes. Then, filtration was performed using a 5.0 μm PTFE filter (Syringe filter, manufactured by Whatman) and 0.2 μm PTFE filter (DISMIC-13JP, manufactured by Advantec) to prepare an amorphous silicon forming composition A.

In the amorphous silicon forming composition A, the ratio of the number of silicon atoms contained in the cyclic polysilane to that of silicon atoms contained in polysilazane was 27.4.

The amorphous silicon forming composition A was coated on a Si substrate in a nitrogen atmosphere using a spin coater (Spin Coater 1HDX2 (trade name), manufactured by Mikasa Co., Ltd.) to form a coating film. In addition, application conditions were 20 seconds at 1,000 rpm after 5 seconds at 100 rpm. The obtained coating film was heated (prebaked) at 150° C. for 60 seconds on a hot plate in nitrogen. Thereafter, the film was heated at 340° C. for 15 minutes on a hot plate to obtain an amorphous silicon sacrifice film.

When the obtained film was measured by secondary ion mass spectrometry (SIMS), the result thereof was as follows: Si: 97.69 mass %, O: 0.63 mass %, N: 0.92 mass %, C: 0.70 mass %, and H: 0.06 mass %. The diffraction peak of crystalline Si was not observed from the measurement of XRD, by which it was confirmed that the silicon was amorphous silicon.

The film thickness of the obtained amorphous silicon sacrifice film was 87.1 nm, and the refractive index (633 nm) thereof was 2.83. The membrane stress measured with Tencor (trademark) FLX-2320 manufactured by KLA Tencor was 194 MPa (tensile).

Further, it was etched in a 10 mass % potassium hydroxide aqueous solution at 25° C., and the etching rate was 37.4 nm/min. On the other hand, by the etching using a 0.5 mass % hydrofluoric acid aqueous solution at 25° C., the etching rate was 4.4 nm/min, which showed that the film had HF resistance.

Example 2

The amorphous silicon forming composition A obtained in Example 1 was treated as in Example 1 to form a coating film and then the film was heated (prebaked) in nitrogen on a hot plate at 150° C. for 60 seconds. Thereafter, the film was heated at 400° C. for 15 minutes on a hot plate to obtain an amorphous silicon sacrifice film.

Example 3

The amorphous silicon forming composition A obtained in Example 1 was treated as in Example 1 to form a coating film and then the film was heated (prebaked) in nitrogen on a hot plate at 150° C. for 60 seconds. Thereafter, 18 J/cm$^2$ of light having the wavelength of 405 nm was irradiated and heating was performed on a hot plate at 400° C. for 15 minutes to obtain an amorphous silicon sacrifice film.

Example 4

In the same manner as in Example 1 except that ultraviolet irradiation of 365 nm was replaced with that of 405 nm, an amorphous silicon forming composition B was prepared. The obtained amorphous silicon forming composition B was treated as in Example 1 to form a coating film and then the film was heated (prebaked) in nitrogen on a hot plate at 150° C. for 60 seconds. Thereafter, the film was heated at 400° C. for 15 minutes on a hot plate to obtain an amorphous silicon sacrifice film.

Example 5

In the same manner as in Example 1 except that 1.11 g (6.15 mmol) of cyclohexasilane and 29.20 mg (0.324 mmol) of polyperhydrosilazane solution adjusted to a concentration of 50 mass % with cyclooctane and having the mass average molecular weight of 5,800 were used, an amorphous silicon forming composition C was prepared.

In the amorphous silicon forming composition C, the ratio of the number of silicon atoms contained in the cyclic polysilane to that of silicon atoms contained in polysilazane was 114.

The amorphous silicon forming composition C was treated as in Example 1 to form a coating film and then the film was heated (prebaked) in nitrogen on a hot plate at 150° C. for 60 seconds. Thereafter, 18 J/cm$^2$ of light having the wavelength of 405 nm was irradiated and heating was performed on a hot plate at 400° C. for 15 minutes to obtain an amorphous silicon sacrifice film.

Example 6

In the same manner as in Example 1 except that 574.2 mg (3.19 mmol) of cyclohexasilane and 30.12 mg (0.335 mmol) of polyperhydrosilazane solution adjusted to a concentration of 50 mass % with cyclooctane and having the mass average molecular weight of 5,800 were used, an amorphous silicon forming composition D was prepared.

In the amorphous silicon forming composition D, the ratio of the number of silicon atoms contained in the cyclic polysilane to that of silicon atoms contained in polysilazane was 57.

The amorphous silicon forming composition D was treated as in Example 1 to form a coating film and then the film was heated (prebaked) in nitrogen on a hot plate at 150° C. for 60 seconds. Thereafter, 18 J/cm$^2$ of light having the wavelength of 405 nm was irradiated and heating was performed on a hot plate at 600° C. for 15 minutes to obtain an amorphous silicon sacrifice film.

Example 7

In the same manner as in Example 1 except that 64.32 mg (0.357 mmol) of cyclohexasilane and 32.21 mg (0.358 mmol) of polyperhydrosilazane solution adjusted to a concentration of 50 mass % with cyclooctane and having the mass average molecular weight of 5,800 were used, an amorphous silicon forming composition E was prepared.

In the amorphous silicon forming composition E, the ratio of the number of silicon atoms contained in the cyclic polysilane to that of silicon atoms contained in polysilazane was 6.

The amorphous silicon forming composition E was treated as in Example 1 to form a coating film and then the film was heated (prebaked) in nitrogen on a hot plate at 150° C. for 60 seconds. Thereafter, 18 J/cm$^2$ of light having the wavelength of 405 nm was irradiated and heating was performed on a hot plate at 600° C. for 15 minutes to obtain an amorphous silicon sacrifice film.

Example 8

In the same manner as in Example 1 except that 78.84 mg (0.439 mmol) of cyclohexasilane and 62.18 mg (0.691 mmol) of polyperhydrosilazane solution adjusted to a concentration of 50 mass % with cyclooctane and having the mass average molecular weight of 5,800 were used, an amorphous silicon forming composition F was prepared.

In the amorphous silicon forming composition F, the ratio of the number of silicon atoms contained in the cyclic polysilane to that of silicon atoms contained in polysilazane was 3.8.

The amorphous silicon forming composition F was treated as in Example 1 to form a coating film and then the film was heated (prebaked) in nitrogen on a hot plate at 150° C. for 60 seconds. Thereafter, 18 J/cm$^2$ of light having the wavelength of 405 nm was irradiated and heating was performed on a hot plate at 600° C. for 15 minutes to obtain an amorphous silicon sacrifice film.

Example 9

In the same manner as in Example 1 except that 76.06 mg (0.422 mmol) of cyclohexasilane and 150.2 mg (1.69 mmol) of polyperhydrosilazane solution adjusted to a concentration of 50 mass % with cyclooctane and having the mass average molecular weight of 5,800 were used, an amorphous silicon forming composition G was prepared.

In the amorphous silicon forming composition G, the ratio of the number of silicon atoms contained in the cyclic polysilane to that of silicon atoms contained in polysilazane was 1.5.

The amorphous silicon forming composition G was treated as in Example 1 to form a coating film and then the film was heated (prebaked) in nitrogen on a hot plate at 150° C. for 60 seconds. Thereafter, 18 J/cm$^2$ of light having the wavelength of 405 nm was irradiated and heating was performed on a hot plate at 600° C. for 15 minutes to obtain an amorphous silicon sacrifice film.

Comparative Example 1

A stirrer tip was placed in a 6 mL screw tube, and 272 mg (1.5 mmol) of cyclohexasilane was added thereto and stirring was carried out using a stirrer. Here, 8.6 J/cm$^2$ of ultraviolet ray having the wavelength of 365 nm was irradiated using a mercury xenon lamp as a light source. After the irradiation, 98.4 J/cm$^2$ of ultraviolet ray having the wavelength of 365 nm was irradiated using a mercury xenon lamp as a light source. Thereafter, cyclooctane was added so as to make the solid content concentration become 19 mass % and stirring was carried out for 3 minutes. Then, filtration was performed using a 5.0 μm PTFE filter and 0.2 μm PTFE filter to obtain a comparative composition A.

The comparative composition A was coated on a Si substrate in a nitrogen atmosphere using a spin coater to try to form a coating film, but the comparison composition A was not able to be coated on the substrate and did not lead to film formation.

Comparative Example 2

A 20 mass % cyclooctane solution of polyperhydrosilazane having the mass average molecular weight of 5,800 was prepared, a coating film was formed in the same manner as in Example 1, and then the film was heated (prebaked) in nitrogen on a hot plate at 150° C. for 60 seconds. Thereafter, the film was heated at 400° C. for 15 minutes on a hot plate to obtain a film of Comparative Example 2.

The diffraction peak of crystalline Si was not observed from the measurement of XRD with respect to the amorphous silicon sacrifice films in Examples 2 to 9, by which it was confirmed that these were amorphous silicon. With respect to these amorphous silicon sacrifice films and the film of Comparative Example 2, film thickness, refractive index, film stress and etching rate were measured in the same manner as in Example 1. The etching was carried out using HF and KOH that are at room temperature (20 to 30° C.) and TMAH that is heated to 60° C. The obtained results were as shown in Table 1.

TABLE 1

|  |  | Film thickness (nm) | Refractive index @633 nm | Film stress (Mpa) | etching rate 0.5% HF (nm/min) | etching rate 10% KOH (nm/min) | etching rate 60° C. 10% TMAH (nm/min) |
|---|---|---|---|---|---|---|---|
| Example | 1 | 87.1 | 2.83 | 194 | 4.4 | 37.4 | — |
|  | 2 | 117 | 3.05 | 498 | 0.4 | 23.2 | — |
|  | 3 | 167 | 3.09 | 486 | 0.4 | 27.5 | — |
|  | 4 | 202 | 3.18 | 320 | 0.5 | 18.6 | — |
|  | 5 | 75 | 3.22 | 181 | 0.2 | 60.0 | — |
|  | 6 | 73 | 3.73 | 368 | 0.0 | 0.1 | 204 |
|  | 7 | 113 | 3.00 | 494 | 17.1 | 0.1 | 217 |
|  | 8 | 202 | 3.13 | 465 | 16.8 | 0.1 | 226 |
|  | 9 | 219 | 3.08 | 392 | 18.3 | 0.1 | 232 |
| Comparative example | 2 | 610 | 1.57 | −340 (compression) | 424.5 | 117.8 | — |

The invention claimed is:

1. A method for producing an amorphous silicon sacrifice film comprising:
   (i) polymerizing a cyclic polysilane comprising 5 or more silicon or a composition comprising the cyclic polysilane by light irradiation and/or heating to form a polymer having a polysilane skeleton,
   (ii) applying an amorphous silicon forming composition comprising the polymer having a polysilane skeleton, a polysilazane, and a solvent above a substrate to form a coating film, and
   (iii) heating the coating film in a non-oxidizing atmosphere;
   wherein a ratio of the number of silicon atoms contained in the cyclic polysilane to that of silicon atoms contained in the polysilazane is 0.3 to 114.

2. The method according to claim 1, wherein the cyclic polysilane is represented by the following formula (I):

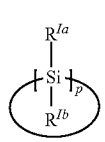

(I)

wherein $R^{1a}$ and $R^{1b}$ are each independently hydrogen, halogen, $C_{1-6}$ alkyl, or $C_{6-10}$ aryl, and p is an integer of 5 or more.

3. The method according to claim 1, wherein the light irradiation in (i) is to irradiate light having the wavelength of 248 to 436 nm.

4. The method according to claim 1, wherein the polysilazane comprises 20 or more repeating units selected from the group consisting of the following formulas (11-1) to (11-6):

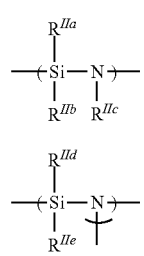

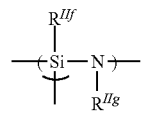

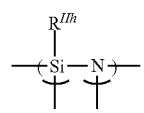

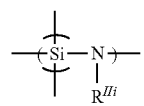

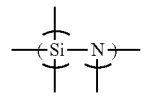

wherein $R^{IIa}$ to $R^{IIi}$ are each independently hydrogen or $C_{1-4}$ alkyl.

5. The method according to claim 1, wherein a mass average molecular weight of said polysilazane is 900 to 15,000.

6. The method according to claim 1, wherein the cyclic polysilane is selected from silyl cyclopentasilane, silyl cyclohexasilane, disilyl cyclohexasilane, cyclopentasilane and cyclohexasilane.

7. The method according to claim 1, wherein the polysilazane is perhydropolysilazane.

8. The method according to claim 1, wherein light having the wavelength of 248 to 436 nm is further irradiated after the formation of the coating film in (ii).

9. The method according to claim 1, wherein the heating in (iii) is performed at 200 to 1,000° C.

10. The method according to claim 1, wherein an etching rate of the amorphous silicon sacrifice film to a 0.5 mass % hydrofluoric acid aqueous solution is 0 to 100 nm/min.

11. A method for manufacturing electronic devices, comprising:
   producing an amorphous silicon sacrifice film by the method according to claim 1, and removing said amorphous silicon sacrifice film by etching using an aqueous alkaline solution.

12. An amorphous silicon forming composition comprising:
   (a) a polymer having a polysilane skeleton, which is formed by polymerizing a cyclic polysilane containing 5 or more silicon or a composition containing the cyclic polysilane by light irradiation and/or heating;
(b) a polysilazane; and
(c) a solvent;
wherein the ratio of the number of silicon atoms contained in the cyclic polysilane to that of silicon atoms contained in the polysilazane is 0.3 to 114.

* * * * *